(12) United States Patent
Lopez-Julia et al.

(10) Patent No.: US 11,362,243 B2
(45) Date of Patent: Jun. 14, 2022

(54) OPTICAL COUPLING LAYER TO IMPROVE OUTPUT FLUX IN LEDS

(71) Applicant: LUMILEDS LLC, San Jose, CA (US)

(72) Inventors: Antonio Lopez-Julia, Aachen (DE); Jens Meyer, Aachen (DE); Marcel van Gerwen, Aachen (DE); Ronja Missong, Aachen (DE); Joerg Feldmann, Aachen (DE); Hans-Helmut Bechtel, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/066,266

(22) Filed: Oct. 8, 2020

(65) Prior Publication Data
US 2021/0111320 A1  Apr. 15, 2021

Related U.S. Application Data

(63) Continuation-in-part of application No. 16/597,455, filed on Oct. 9, 2019.

(30) Foreign Application Priority Data

Feb. 14, 2020 (EP) .................................. 20157448

(51) Int. Cl.
*H01L 33/58* (2010.01)
*H01L 25/075* (2006.01)
*H01L 33/00* (2010.01)
*H01L 33/32* (2010.01)
*H01L 33/50* (2010.01)

(52) U.S. Cl.
CPC .......... *H01L 33/58* (2013.01); *H01L 25/0753* (2013.01); *H01L 33/0075* (2013.01); *H01L 33/32* (2013.01); *H01L 33/502* (2013.01); *H01L 2933/0058* (2013.01)

(58) Field of Classification Search
CPC ..... H01L 25/075; H01L 33/46; H01L 33/502; H01L 33/54; H01L 33/58
See application file for complete search history.

(56) References Cited

U.S. PATENT DOCUMENTS 7,521,862 B2   4/2009   Mueller et al.
8,721,098 B2   5/2014   Bechtel et al.
8,994,259 B2   3/2015   Tamaki et al.
(Continued)

FOREIGN PATENT DOCUMENTS

EP   1367655 A1   12/2003
EP   2645433 A2   10/2013
(Continued)

OTHER PUBLICATIONS

Extended European Search Report, EP Application No. 20157448.0, dated Jul. 3, 2020, 14 pages.
(Continued)

*Primary Examiner* — Elias Ullah

(57) ABSTRACT

An optical coupling structures are disposed on light output surfaces of semiconductor LEDs of a miniLED or microLED array to facilitate coupling of light emitted by the semiconductor LEDs through the light output surfaces. The optical coupling structures comprise light scattering particles and/or air voids embedded in or coated with a thin layer of a material that has an index of refraction close to or matching the index of refraction of the material forming the light output surface of the semiconductor LEDs.

22 Claims, 11 Drawing Sheets

(56) References Cited

U.S. PATENT DOCUMENTS

| | | |
|---|---|---|
| 9,865,577 B2 | 1/2018 | Bibl et al. |
| 11,177,420 B2 | 11/2021 | Lopez-Julia et al. |
| 2005/0093008 A1 | 5/2005 | Suehiro et al. |
| 2007/0273282 A1 | 11/2007 | Radkov et al. |
| 2007/0298250 A1 | 12/2007 | Weimer et al. |
| 2008/0084150 A1 | 4/2008 | Cok |
| 2008/0121917 A1 | 5/2008 | Weisbuch et al. |
| 2012/0223875 A1 | 9/2012 | Lau et al. |
| 2015/0255683 A1 | 9/2015 | Stoll et al. |
| 2016/0149097 A1 | 5/2016 | Saka et al. |
| 2017/0235216 A1 | 8/2017 | Maeda et al. |
| 2018/0122993 A1 | 5/2018 | Camras et al. |
| 2018/0123005 A1 | 5/2018 | Ozeki et al. |
| 2018/0190712 A1 | 7/2018 | Xu et al. |
| 2018/0313501 A1 | 11/2018 | Anc et al. |
| 2019/0093871 A1 | 3/2019 | Sato et al. |
| 2019/0169494 A1 | 6/2019 | Nakamura et al. |
| 2019/0198564 A1 | 6/2019 | Tandon et al. |
| 2020/0142288 A1 | 5/2020 | Okuno et al. |
| 2020/0203567 A1 | 6/2020 | Basin et al. |
| 2020/0388726 A1 | 12/2020 | Meyer et al. |
| 2020/0411736 A1 | 12/2020 | Bechtel et al. |
| 2021/0063652 A1 | 3/2021 | Tångring et al. |
| 2021/0111316 A1 | 7/2021 | Lopez-Julia et al. |

FOREIGN PATENT DOCUMENTS

| | | | |
|---|---|---|---|
| EP | 2645433 | A3 | 1/2016 |
| JP | 2013-203822 | A | 10/2013 |
| JP | 2016-523450 | A | 8/2016 |
| KR | 2009-0082499 | A | 7/2009 |
| WO | 2008007232 | A2 | 1/2008 |
| WO | 2010/053341 | A1 | 5/2010 |
| WO | 2016/041838 | A1 | 3/2016 |
| WO | 2019/141480 | A1 | 7/2019 |
| WO | 2019141480 | A1 | 7/2019 |

OTHER PUBLICATIONS

From the EPO as the ISA, "Notification of Transmittal of the International Search Report and the Written Opinion of the International Searching Authority, or the Declaration", corresponding to PCT/US2020/054938, dated Jan. 26, 2021, 20 pages.

From the EPO as the ISA, "Notification of Transmittal of the International Search Report and the Written Opinion of the International Searching Authority, or the Declaration", PCT/US2020/054938, dated Jan. 26, 2021, 20 pages.

From the EPO as the ISA, Notification of Transmittal of The International Search Report and the Written Opinion of the International Searching Authority, corresponding to PCT/EP2020/062258, dated Aug. 31, 2020, 12 pages.

The extended European Search Report, EP19178430.5, dated Dec. 6, 2019, 6 pages.

European Search Report corresponding to EP19182324, dated Jan. 3, 2020, 12 pages.

From the International Search Authority, Notification of Transmittal of the International Search Report and the Written Opinion of the EPO as the ISA corresponding to PCT/EP2020/064856, dated Sep. 2, 2020, 13 pages.

Abstract of EP2356702A1, Aug. 17, 2011, Applicant Uab Hortiled, corresponding to WO2010053341A1,1 page.

The extended European Search Report corresponding to EP 19182324, Apr. 15, 2020, 11 pages.

US 11,362,243 B2

OPTICAL COUPLING LAYER TO IMPROVE OUTPUT FLUX IN LEDS

PRIORITY CLAIM TO RELATED APPLICATIONS

This application is a continuation-in-part of U.S. application Ser. No. 16/597,455 filed 9 Oct. 2019. This application claims priority of EP App No 20157448.0 filed 14 Feb. 2020. Both of said applications are incorporated by reference in their entireties.

FIELD OF THE INVENTION

The invention relates generally to light emitting diodes and to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs can be formed together on a single substrate to form an array. Such arrays can be employed to form active illuminated displays, such as those employed in smartphones and smart watches, computer or video displays, or signage. An array having one or several or many individual devices per millimeter (e.g., device pitch of a about a millimeter, a few hundred microns or less than 100 microns, and spacing between adjacent devices less than 100 microns or only a few tens of microns or less) typically is referred to as a miniLED array (100 μm to a millimeter) or a microLED array (alternatively, a μLED array; 100 μm or smaller). Such miniLED or microLED arrays can in many instances also include phosphor converters as described above; such arrays can be referred to as pc-miniLED arrays or pc-microLED arrays.

SUMMARY

This specification discloses optical coupling structures disposed on the light output surface of a semiconductor miniLED or microLED array to facilitate coupling of light emitted by each semiconductor LED of the array through its corresponding light output surface, into the external environment or into another optical element or component of the miniLED or microLED array. The optical coupling structures comprise light scattering particles and/or air voids embedded in or coated with a thin layer of a material that has an index of refraction close to or matching the index of refraction of the material forming the light output surface of the semiconductor LED.

In one aspect, such an optical coupling structure can be disposed in a pc-miniLED array or a pc-microLED array between and in contact with the light output surfaces of the semiconductor LEDs of the array and the wavelength converting structure (e.g., phosphor layer) to facilitate coupling of light emitted by each semiconductor LED of the array through its corresponding light output surface into the wavelength converting structure.

In another aspect, the miniLED or microLED array can include a thin protective layer between the light output surfaces of the LEDs of the array any the optical coupling structure. Such a protective layer can be inert or refractory with respect to reagents or reaction conditions employed to form the optical coupling structure.

Objects and advantages pertaining to LEDs, pcLEDs, miniLED and microLED arrays, and pc-miniLED and pc-microLED arrays may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, individual LEDs may be exaggerated in their vertical dimensions or layer thicknesses relative to their lateral extent or relative to substrate or phosphor thicknesses. The embodiments shown are only examples and should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
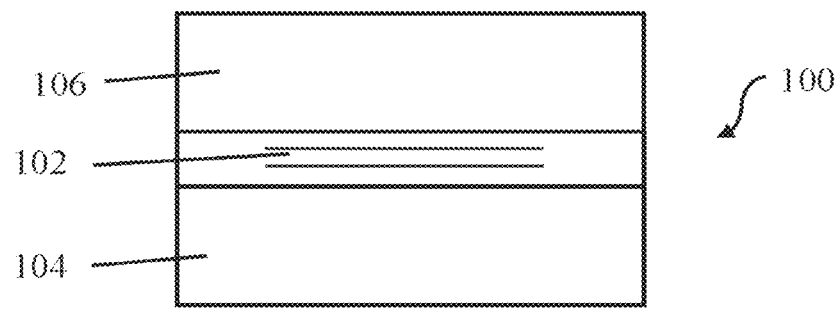
FIG. 1 shows a schematic cross-sectional view of an example pcLED.

FIG. 1 shows an example of an individual pcLED 100 comprising a semiconductor diode structure 102 disposed on a substrate 104, together considered herein an "LED", and a wavelength converting structure (e.g., phosphor layer) 106 disposed on the LED. Semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output from the pcLED.

Figure 2A:
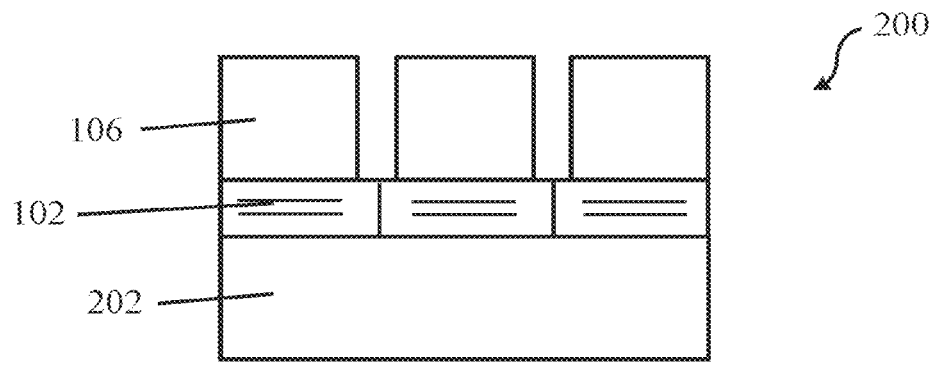
FIGS. 2A and 2B show, respectively, cross-sectional and top schematic views of an example array of pcLEDs.
Figure 2B:
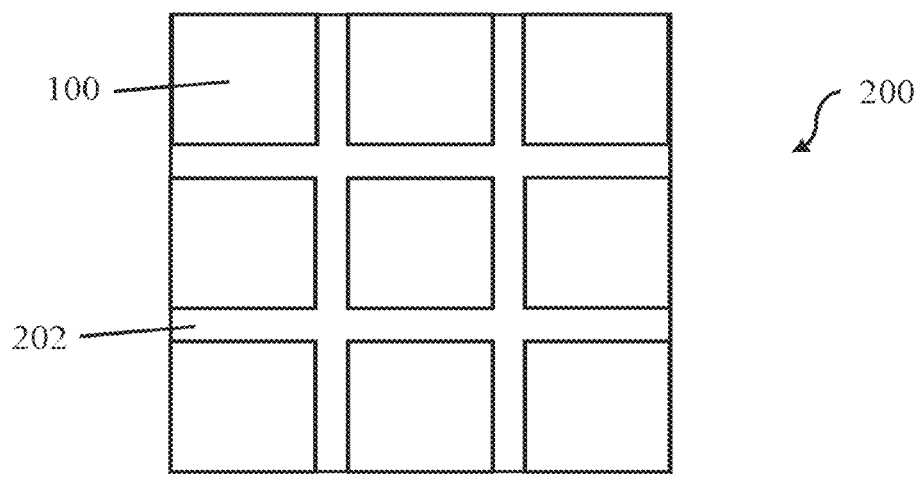

FIGS. 2A-2B show, respectively, cross-sectional and top views of an array 200 of pcLEDs 100, each including a phosphor pixel 106, disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable materials.

Figure 3A:
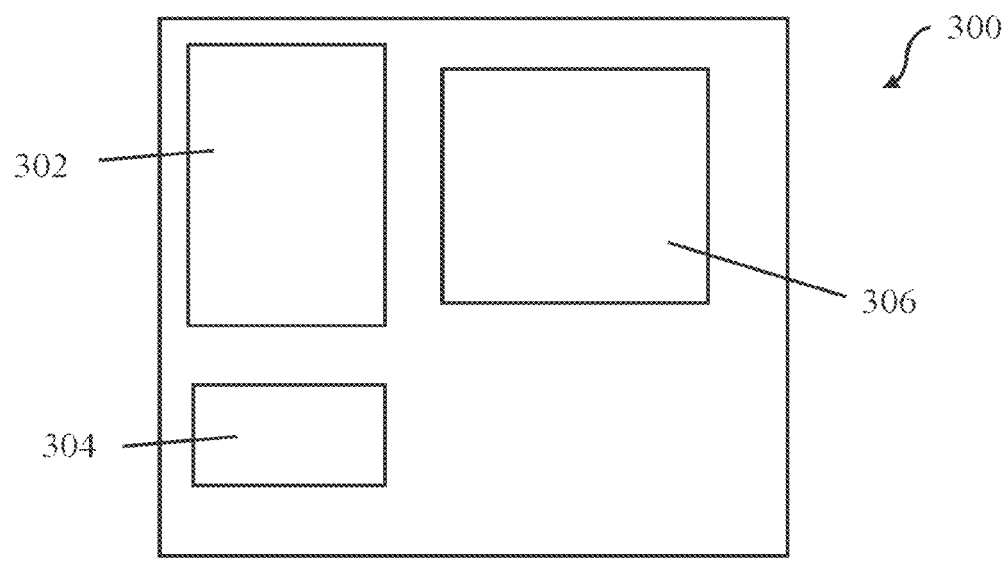
FIG. 3A shows a schematic top view an example electronics board on which an array of pcLEDs may be mounted, and FIG. 3B similarly shows an example array of pcLEDs mounted on the electronic board of FIG. 3A.
Figure 3B:
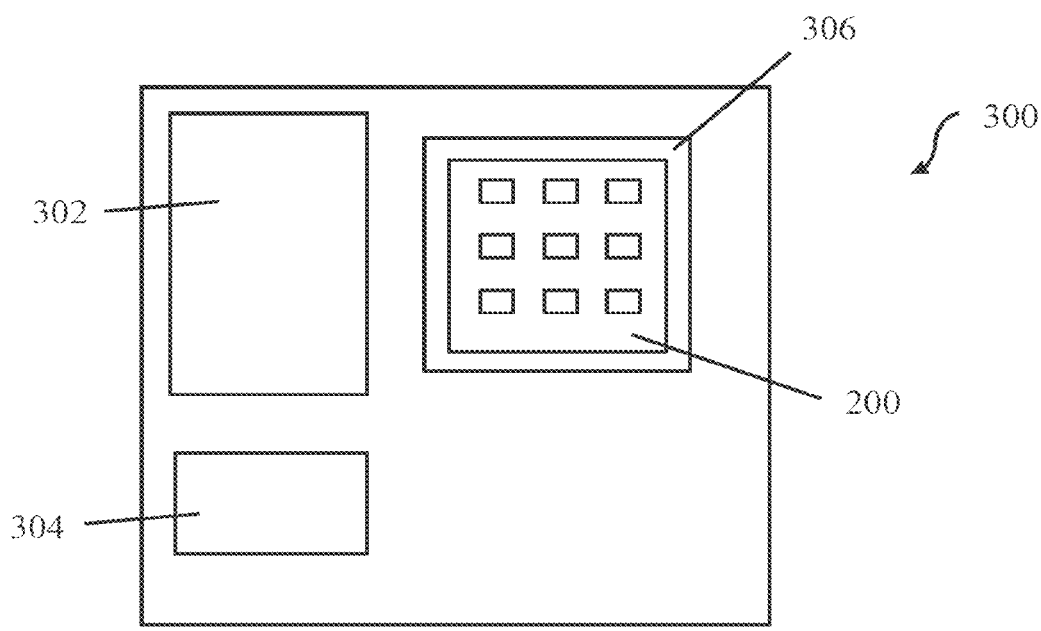

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
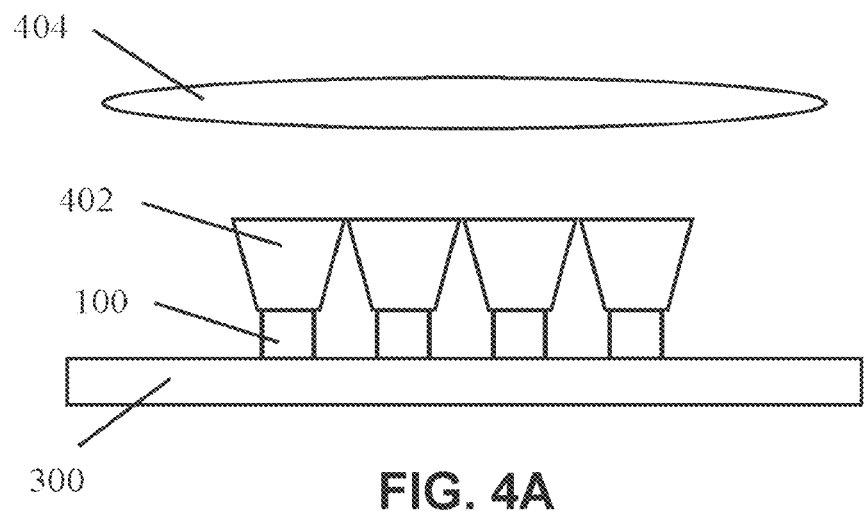
FIG. 4A shows a schematic cross-sectional view of an example array of pcLEDs arranged with respect to waveguides and a projection lens.
Figure 4B:
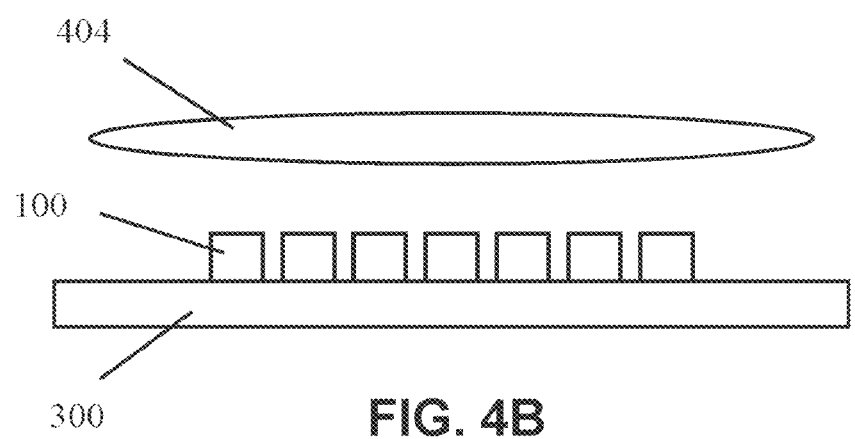
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A miniLED or microLED display application may use similar optical arrangements to those depicted in FIGS. 4A-4B, for example. Generally, any suitable arrangement of optical elements may be used in combination with the pcLEDs described herein, depending on the desired application.

FIG. 1A may include, over 10,000 pixels in any applicable arrangement such as a 100.times.100 matrix, a 200.times.50 matrix, a symmetric matrix, a non-symmetric matrix, or the like. It will also be understood that multiple sets of pixels, matrixes, and/or boards may be arranged in any applicable format to implement the embodiments disclosed herein.

Figure 2C:
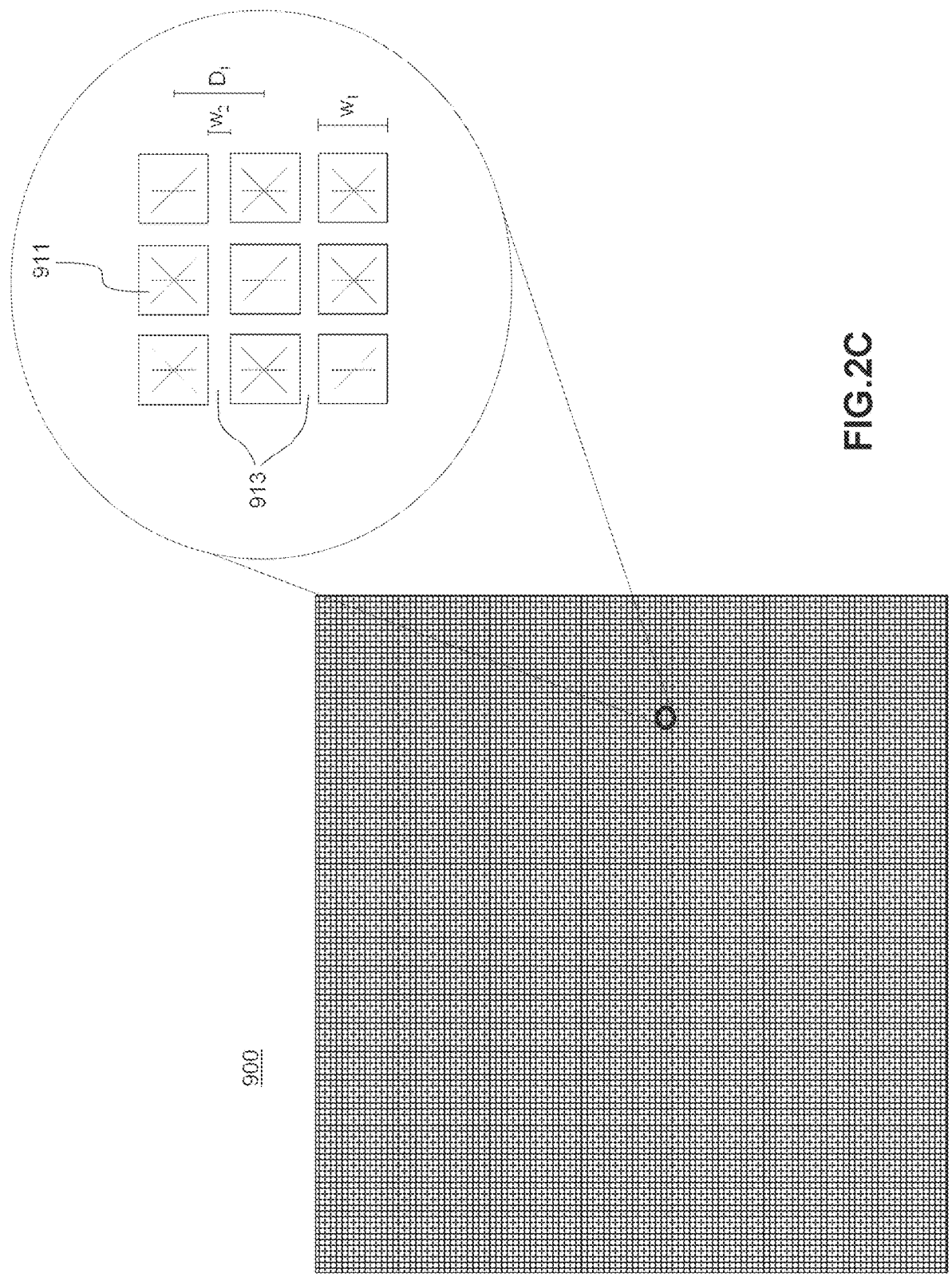
FIG. 2C shows a top schematic view of an example miniLED or microLED array and an enlarged section of 3×3 LEDs of the array.

Although FIGS. 2A and 2B show a 3×3 array of nine pcLEDs, such arrays may include for example on the order of $10^2$, $10^3$, $10^4$, or more LEDs, e.g., as illustrated schematically in FIG. 2C. Individual LEDs 911 (i.e., pixels) may have widths $w_1$ (e.g., side lengths) in the plane of the array 900, for example, less than or equal to 1 millimeter (mm), less than or equal to 500 microns, less than or equal to 100 microns, or less than or equal to 50 microns. LEDs 911 in the array 900 may be spaced apart from each other by streets, lanes, or trenches 913 having a width $w_2$ in the plane of the array 900 of, for example, hundreds of microns, less than or equal to 100 microns, less than or equal to 50 microns, less than or equal to 20 microns, less than or equal to 10 microns, or less than or equal to 5 microns. The pixel pitch $D_1$ is the sum of $w_1$ and $w_2$. Although the illustrated examples show rectangular pixels arranged in a symmetric matrix, the pixels and the array may have any suitable shape or arrangement. Multiple separate arrays of LEDs can be combined in any suitable arrangement in any applicable format.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

Figure 2D:
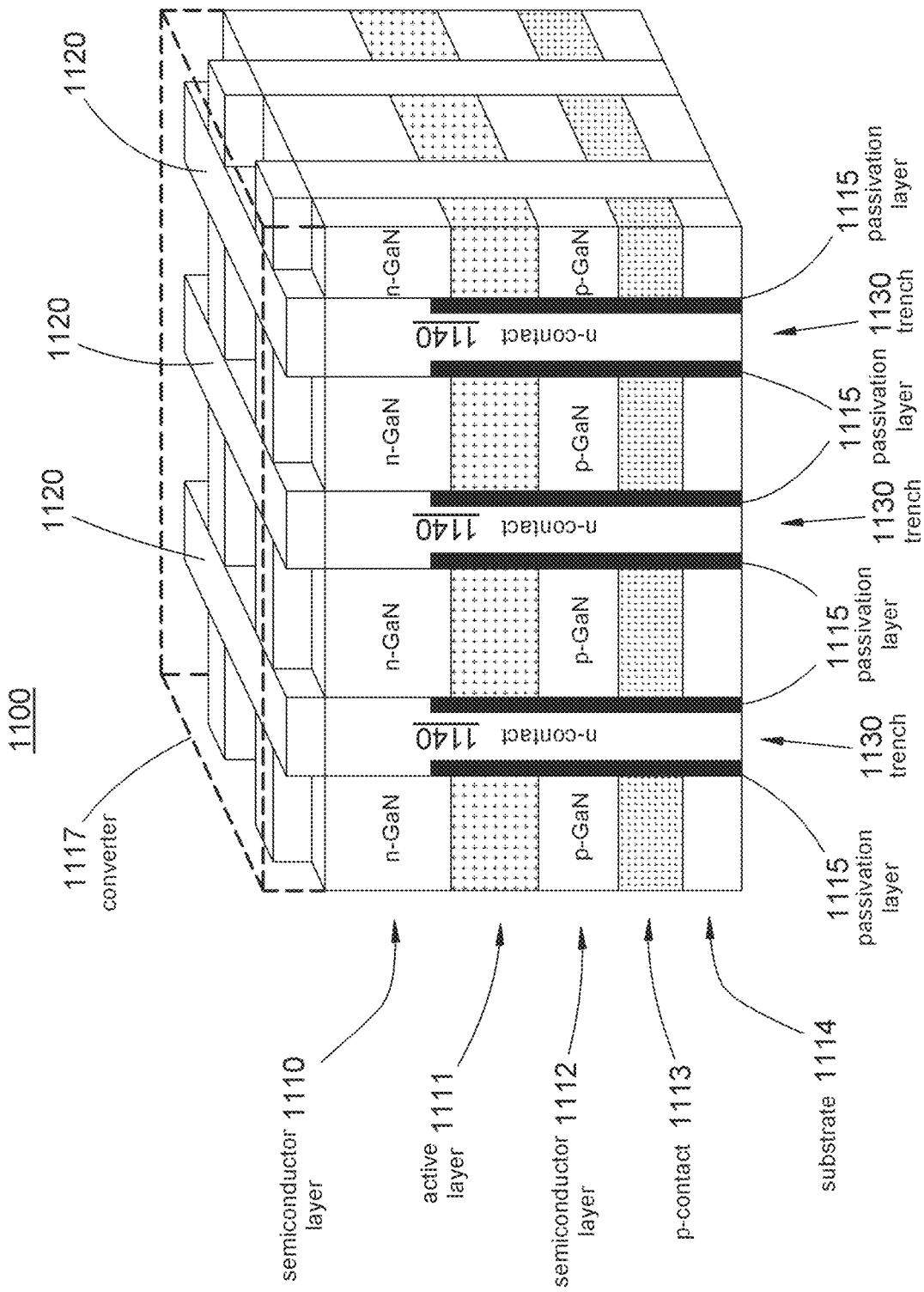
FIG. 2D shows a perspective view of several LEDs of an example pc-miniLED or pc-microLED array monolithically formed on a substrate.

An array of LEDs, miniLEDs, or microLEDs, or portions of such an array, may be formed as a segmented monolithic structure in which individual LED pixels are electrically isolated from each other by trenches and or insulating material. FIG. 2D shows a perspective view of an example of such a segmented monolithic array 1100. Pixels in this array are separated by trenches 1130 which are filled to form n-contacts 1140. The monolithic structure is grown or disposed on a substrate 1114. Each pixel includes a p-contact 1113, a p-GaN semiconductor layer 1112, an active region 1111, and an n-GaN semiconductor layer 1110. A wavelength converter material 1117 may be deposited on the semiconductor layer 1110 (or other applicable intervening layer). Passivation layers 1115 may be formed within the trenches 1130 to separate at least a portion of the n-contacts 1140 from one or more layers of the semiconductor. The n-contacts 1140, or other material within the trenches, may extend into the converter material 1117 such that the n-contacts 1140 or other structures or materials provide complete or partial optical isolation barriers 1120 between the pixels.

The individual LEDs (pixels) in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. The light emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

This disclosure concerns the manufacture and use of an optical coupling structure that improves light extraction and package efficiency in light emitting diodes, for example in phosphor-converted light emitting diodes. In this disclosure, light extraction refers to the coupling of light generated in the semiconductor LED out of the semiconductor LED, for example out of the semiconductor LED and into a wavelength converting structure (e.g., into a phosphor layer). Package efficiency refers to extraction of light out of the wavelength converting structure as the desired output from the pcLED. Package efficiency may be defined, for example, as the ratio of the number of photons output from the pcLED to the number of photons coupled into the wavelength converter from the semiconductor LED.

In III-V (e.g., AlInGaN and AlInGaP) LEDs the coupling of light out of the semiconductor LED into the external environment (e.g., air) or into another optical component (e.g., into a lens or into a wavelength converting structure) may be limited by reflections occurring at the interface between the semiconductor light emitting diode and the external environment or other optical component. Reflections at that interface may be significant, for example, if the output surface of the semiconductor LED is a III-V semiconductor (e.g., GaN, AlN, AlGaN, GaP, AlGaP, AlInGaP) surface having a significantly higher refractive index than the external environment or other optical element. Light reflected at this interface back into the semiconductor LED may be absorbed in the LED.

For example, in III-Nitride pcLEDs the coupling of light from the semiconductor LED into the wavelength converting structure may be limited by reflections occurring at the interface between the semiconductor light emitting diode and the wavelength converting structure. Reflections at that interface may be significant, for example, if the output surface of the semiconductor LED is a surface of a III-Nitride (e.g., GaN, AlN, AlGaN) layer having a high refractive index and the wavelength converting structure has a significantly lower refractive index, as is typically the case for a wavelength converting structure comprising inorganic phosphor particles dispersed in a silicone binder. Light reflected at this interface back into the semiconductor LED may be absorbed in the LED, decreasing overall efficiency of the pcLED.

Further, if the wavelength converting structure is strongly scattering, light coupled into the wavelength converting structure from the semiconductor LED and light emitted in the wavelength converting structure may be scattered back into the semiconductor LED and absorbed. This also decreases overall efficiency of the pcLED.

One conventional approach for increasing the coupling of light out of a semiconductor LED (e.g., into a wavelength converting structure) is to pattern the light output surface of the semiconductor LED with a texture that reduces the amount of light reflected at the interface between the semiconductor LED and the wavelength converter. The patterning may be done for example by growing the semiconductor LED on a patterned sapphire surface, and then separating the patterned sapphire surface from the semiconductor LED. The surface of the semiconductor LED that was in contact with the sapphire surface is patterned with a texture complementary to that of the patterned sapphire surface.

The use of a patterned surface at the LED/converter interface adds manufacturing complexity, and as explained below may be less suitable for miniLED or microLED architectures than for larger dimension devices.

As summarized above, the optical coupling structures described herein are disposed on the light output surface of the semiconductor LED to facilitate coupling of light out of the semiconductor LED. For example, such an optical coupling structure may be disposed between and in contact with the light output surface of a semiconductor LED and a wavelength converting structure to facilitate coupling of light emitted by the semiconductor LED through the light output surface into the wavelength converting structure.

These optical coupling structures comprise light scattering particles embedded in or coated with a thin layer of a material that has a high index of refraction close to or matching the index of refraction of the material forming the light output surface of the semiconductor LED. Generally, the high index material should have a refractive index as high as possible but not higher than, or not significantly higher than, the index of refraction of the semiconductor layer in the LED at the light output surface (for GaN: 2.5, for AlInGaP: 3.4). The high index material may have an index of refraction of 2 to 2.5, for example. The high index material may have an index of refraction differing from that of the LED light output surface by, for example, less than or equal to 5%, less than or equal to 10%, less than or equal to 15%, less than or equal to 20%, or less than or equal to 25%.

The thin layer of high index material may have a thickness of, for example, greater than or equal to 100 nanometers, or greater than or equal to 200 nanometers, and less than or equal to 2 microns, or less than or equal to 5 microns. The layer of high index material may be thinner than the diameter of the scattering particles, in which case the high index material may conformally coat the light scattering particles. Alternatively the layer of high index material may be thicker than the diameter of the light scattering particles, with the light scattering particles embedded in the layer.

The high index material can include one or more of $Al_2O_3$, $HfO_2$, $SiO_2$, $Ga_2O_3$, $GeO_2$, $SnO_2$, $CrO_2$, $Nb_2O_5$, $TiO_2$, $Ta_2O_5$, $V_2O_5$, $Y_2O_3$, and $ZrO_2$, or combinations thereof. These materials may be particularly suitable where the semiconductor LED light output surface is formed from a III-Nitride material such as GaN or from an AlInGaP material.

The light scattering particles in the optical coupling structure may be for example, phosphor particles. Alternatively, the light scattering particles may be non-luminescent particles having a lower index of refraction than the high index layer. This disclosure considers small volume voids (e.g., filled with air) in the high index layer to be an example of such non-luminescent low index of refraction light scattering particles. The light scattering particles in the optical coupling structure may comprise a combination of phosphor particles and non-luminescent particles. Phosphor particles in the optical coupling structure may have a diameter of, for example, about 2.0 microns to about 3.0 microns, or about 2.0 microns to about 4.0 microns, or about 2.0 microns to about 10. microns and may be formed from doped YAG, for example. Phosphor particles in the optical coupling structure may be of the same type and of the same diameter as phosphor particles in the wavelength converting structure. Any suitable phosphor particles may be used.

Air voids in the high index layer may have a diameter or maximum dimension of less than or equal to about 1.0 micron, for example about 0.20 microns.

The overall thickness of optical coupling structure 505, measured perpendicularly to the semiconductor LED light output surface, may be for example greater than or equal to about 0.20 microns, or greater than or equal to about 1.0 micron, and less than or equal to about 2.0 microns or less than or equal to about 5 microns.

The high index material in the optical coupling structure, index matched or nearly indexed matched to the semiconductor LED output surface, puts the scattering particles in the optical coupling structure in optical contact with the semiconductor LED output surface with no intervening significantly reflective interface between the scattering particles and the semiconductor LED. This enables the scattering particles to play a role similar to conventional texturing of a semiconductor LED output surface, coupling light out of the semiconductor LED and (and, for example, into a wavelength converting structure) and thereby enhances extraction efficiency. For a pcLED, this is analogous to having the semiconductor LED output surface material (e.g., GaN) extend into the wavelength converting structure.

Further, for a pcLED, light scattered in the wavelength converting structure toward the semiconductor LED, in which it might be absorbed, is incident on the optical coupling structure. The scattering particles in the optical coupling structure scatter at least a portion of this light back into wavelength converting structure. This enhances package efficiency.

In LEDs and pcLEDs comprising an optical coupling structure as described herein, the semiconductor LED light output surface may be patterned, or not patterned. If patterned, the patterning may be micron scale or nanometer scale. Generally, the absence of patterning on the light output surface will not limit performance of the pcLED 102, because the optical coupling layer 505 is present. An unpatterned light output surface may be preferred, because epitaxial growth (i.e., "epi") on planar (e.g., unpatterned sapphire) substrates may enable thinner epi (e.g., n-, active, and p-layers combined less than 5 microns, less than 4 microns, less than 3 microns, or less than 2 microns) and hence higher extraction efficiency by way of reducing die/epi absorption losses. Further, index matching between the optical coupling layer and the patterned light output surface of the semiconductor LED makes the patterning on the light output surface optically ineffective.

The optical coupling structures described herein are generally applicable to pcLEDs of various architectures, but may be particularly suitable for miniLED or microLED architectures (e.g., such as the examples of FIGS. 2C and 2D) due to their specific challenges, such as:

poor extraction efficiency due to high die losses;

poor extraction efficiency due to the need for thinner epi motivated, for example, by a reduction of die/epi losses and/or the need of reducing the size of the surface texture conventionally used to maximize extraction efficiency down to the nanometer scale in order to enable suitable surface post-processes (e.g., deposition of interposer grid on GaN surface);

poor package efficiency (highly scattering converter requirements);

light generated in high refractive index layer (e.g., GaN) must be extracted into phosphor layer whose matrix material is usually significantly lower (high index contrast).

Examples of the optical coupling structure are described below with respect to FIGS. 5 through 8. In these examples, a pcLED 100 comprises a semiconductor LED 102, a wavelength converting structure (e.g., phosphor layer) 106, and an optical coupling structure 505, and can in some instances represent a single LED of a miniLED or microLED array. Semiconductor LED 102 comprises a light-emitting active region 102a disposed between semiconductor layer (or layers) 102B and semiconductor layer (or layers) 102C. During operation, light emitted in active region 120A is transmitted through layers 102C, incident on and transmitted through light output surface 102D, and coupled into wavelength converting structure 106 by optical coupling structure 505. Semiconductor LED 102 may be a III-Nitride semiconductor LED, in which case light output surface 102D may be a GaN surface, for example. The example optical coupling structures may similarly be employed on the light output surface of an LED without a wavelength converting structure.

Figure 5:
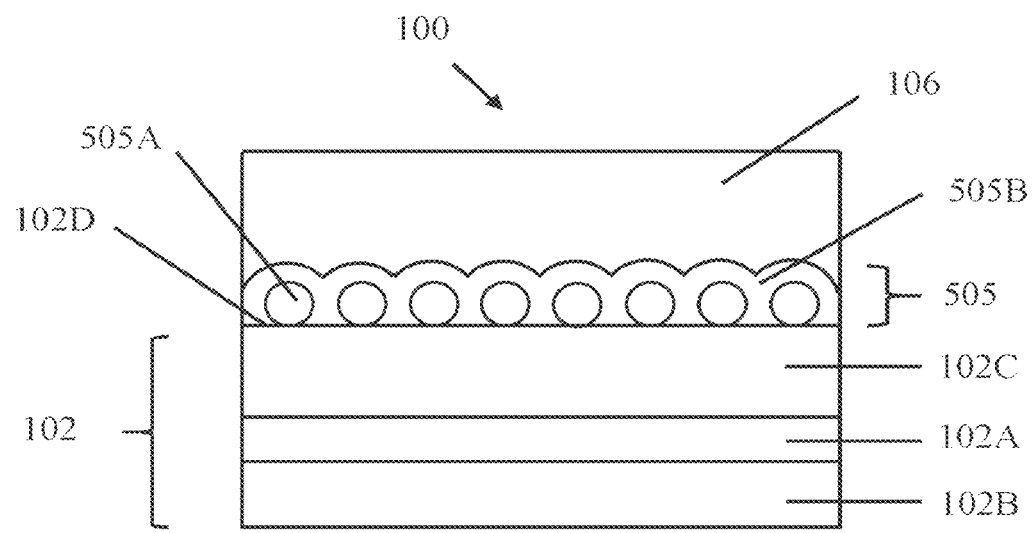
FIG. 5 shows a schematic cross-sectional view of an example pcLED comprising a semiconductor LED, a wavelength converting structure, and an optical coupling structure disposed between the semiconductor LED and the wavelength converting structure.

In the example of FIG. 5, optical coupling structure 505 comprises a single layer of light scattering particles 505A conformally coated with a thin layer 505B of high refractive index material. Layer 505B is index matched, or approximately index matched, to the material of surface 102D, and puts scattering particles 505A in good optical contact with surface 102D and in good optical contact with wavelength converting structure 106. Light scattering particles 505A may be phosphor particles, and may be the same as phosphor particles in wavelength converting structure 106. Particles 505A may have diameters of, for example, about 2 microns to about 4 microns. Layer 505B may have a submicron thickness, for example. Layer 505B may comprise air void regions (not shown in FIGS. 5 or 6) to further promote scattering. In this and the following examples, if light output surface 102D is a surface of a GaN layer, high refractive index material 505B may preferably be $TiO_2$, for example.

Figure 6:
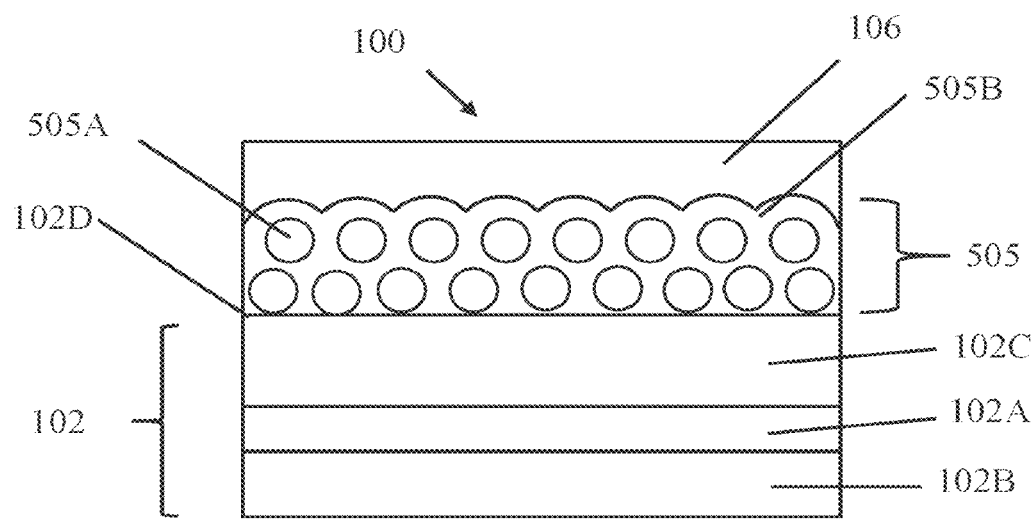
FIG. 6 shows a schematic cross-sectional view of another example pcLED comprising a semiconductor LED, a wavelength converting structure, and an optical coupling structure disposed between the semiconductor LED and the wavelength converting structure.

As shown in the embodiment illustrated in FIG. 6, layer 505B may be thick enough to contain multiple layers of scattering particles (e.g., phosphor grains and/or voids). The resulting optical coupling structure 505 should not be so thick as to fulfill the entire wavelength converter function because the high refractive index matrix of layer 505B would not allow the most efficient conversion in the phosphor particles.

Figure 7:
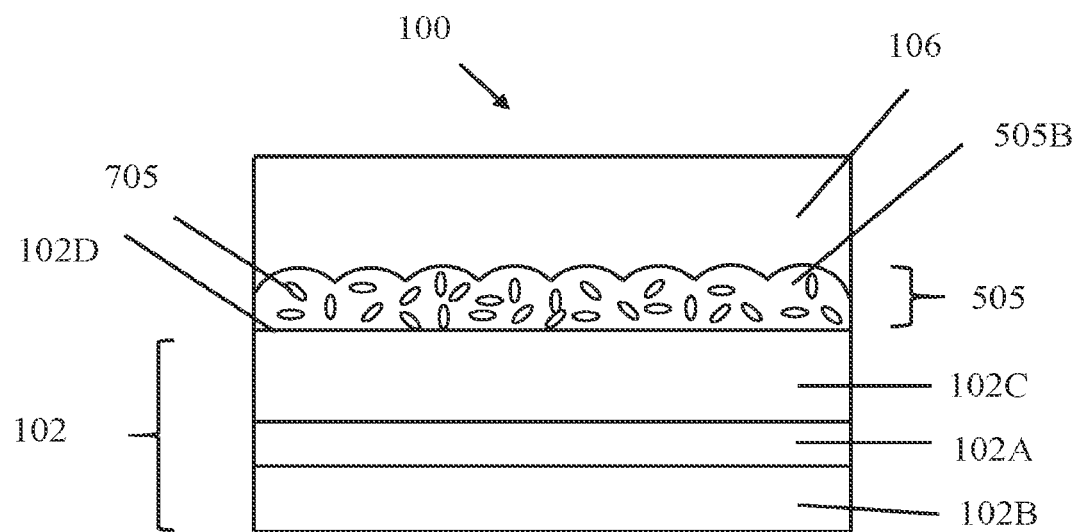
FIG. 7 shows a schematic cross-sectional view of another example pcLED comprising a semiconductor LED, a wavelength converting structure, and an optical coupling structure disposed between the semiconductor LED and the wavelength converting structure.

The embodiment of FIG. 7 illustrates the case where the coupling layer contains air voids 705 as scattering particles instead of or in addition to phosphor grains. These air voids should be nanometer scale (e.g. 200 nanometer diameter).

Figure 8:
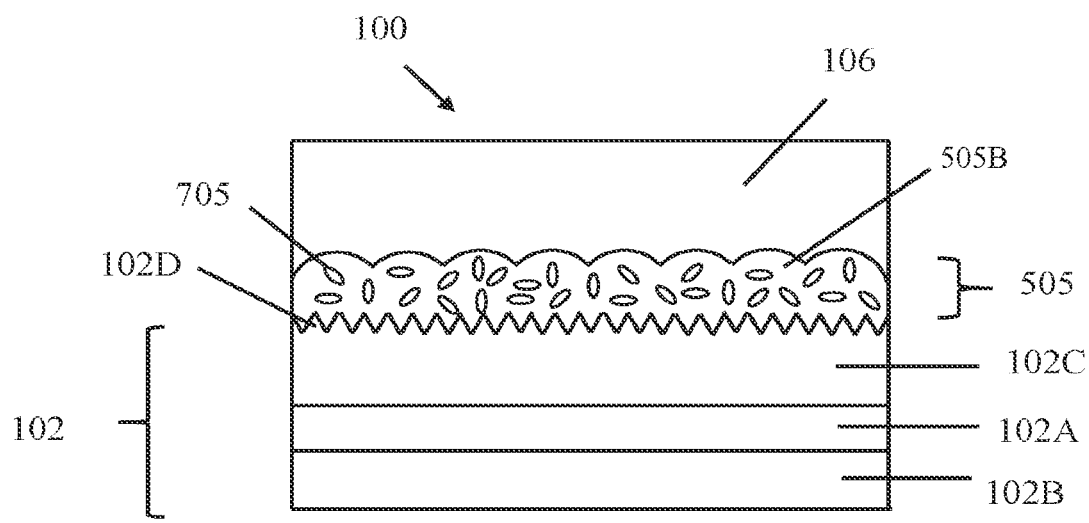
FIG. 8 shows a schematic cross-sectional view of another example pcLED comprising a semiconductor LED, a wavelength converting structure, and an optical coupling structure disposed between the semiconductor LED and the wavelength converting structure.

As noted above, the semiconductor LED light output surface may optionally be patterned, though this is not necessary. FIG. 8 shows an embodiment as in FIG. 7, but with surface 102D patterned. The patterning may be micron scale or nanometer (i.e., sub-micron) scale. Nanometer scale patterning may be consistent with thin (e.g., less than 5 microns thick) epi structures or suitable for implementation in a miniLED or microLED array. Also as noted above, an unpatterned light output surface does not limit performance, due to the presence of optical coupling layer 505 which serves as alternative to promoting high light out-coupling. Epi growth on planar substrates or nano-patterned sapphire substrates may enable thinner epi and hence higher extraction efficiency by way of reducing die/epi absorption losses.

Figure 9A:
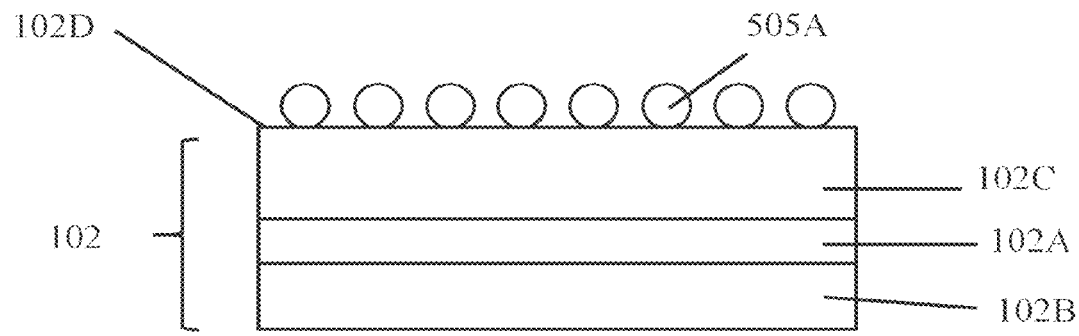
FIGS. 9A, 9B, and 9C illustrate schematically steps in an example method for manufacturing the example pcLED of FIG. 5.
Figure 9B:
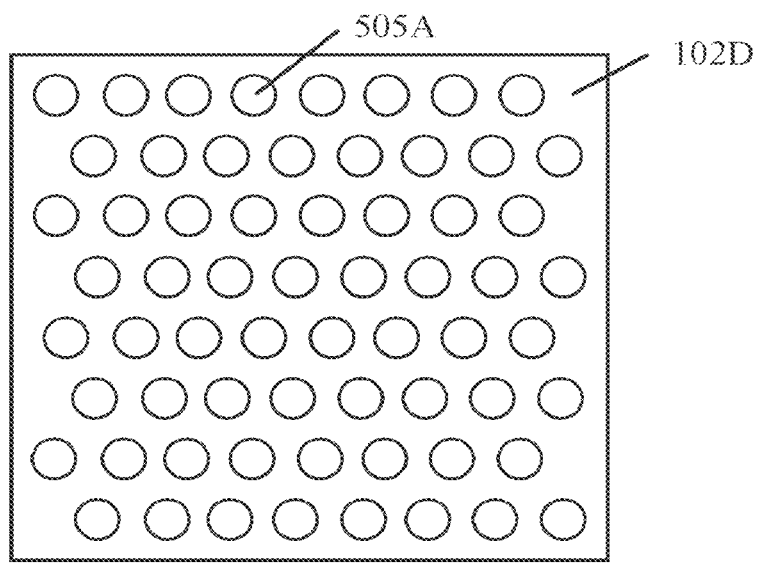
Figure 9C:
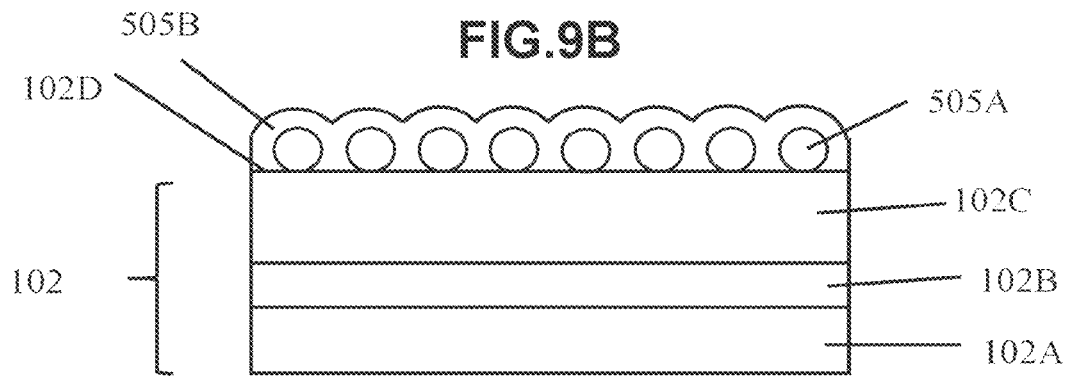

FIGS. 9A through 9C illustrate schematically manufacturing an LED 102 with an optical coupling structure 505, such as are incorporated into the pcLED shown in FIG. 5. In the cross-sectional view of FIG. 9A, a single layer of phosphor particles 505A is deposited on light output surface 102D of semiconductor LED 102. This may be done in any conventional manner, for example by sedimentation. FIG. 9B shows a top vie of phosphor particles 505A disposed on surface 102D. Although for convenience of illustration the particles are shown arranged in a hexagonal array, any suitable arrangement may be used and the arrangement need not be ordered.

Referring now to FIG. 9C, high index of refraction material 505B may be deposited by Atomic Layer Deposition (ALD), for example. Deposition by ALD provides a good optical connection between the particles 505A and surface 102D. ALD is a pulsed chemical vapor deposition (CVD) process which allows the growth of thin layers by applying one atomic layer of a material per cycle. Such process is self-limiting allowing very controlled and conformal coatings even on particles as shown in FIG. 9C. The ALD reaction is split in (at least) two parts. In a first step a metal (oxide) precursor is fed into the reactor and adsorbs and/or reacts with reactive groups on the surfaces and substantially all non-reacted or adsorbed precursor molecules are removed by reactor purging. In a second step an oxygen source is fed into the reactor and reacts with the metal source on the particle surfaces followed by purging of the reactor to remove substantially all remaining oxygen source molecules and hydrolysis products formed by condensation reactions. The two steps lead to formation of an atomic layer (or monolayer) of metal oxide because of the self-limiting nature of the surface reaction. These atomic layer reaction steps are repeated multiple times to form the final ALD coating.

Voids (e.g., as shown in FIGS. 7 and 8) can be embedded in the intermediate coupling layer by allowing partial CVD process reaction.

The term metal oxide precursor especially indicates a precursor of the metal oxide. The precursor itself need not be a metal oxide, but may for example include metal organic molecules. Hence, especially the metal (oxide) precursors for ALD may typically include metal halides, alkoxides, amides, and other metal (organic) compounds. A TiOx layer may be deposited by using one of the following precursors $TiCl_4$, $Ti(OCH_3)_4$ or $Ti(OEt)_4$ at a growth temperature between 80° C. and 250° C. The oxygen source may be $H_2O$, ozone, or oxygen plasma.

In another embodiment a thin $Al_2O_3$ layer is added on top of the $TiO_2$ layer. The $Al_2O_3$ layer may be deposited by using $Al(CH_3)_3$ (TMA), $AlCl_3$ or $HAl(CH_3)_2$ precursor in combination with an oxygen source. As noted above, in alternative embodiments the $TiO_2$ layer may be replaced by another high index material such $SnO_2$, $CrO_2$, $ZrO_2$, $HfO_2$, $Ta_2O_5$ or a combination of such materials by forming a multilayer structure.

In a further step, not shown, a wavelength converting structure 106, for example phosphor particles dispersed in a binder matrix, is disposed on optical coupling layer 505. Typically the matrix in the wavelength converter has a lower index of refraction than that of high index material 505B. The matrix may be or comprise, for example, silicone, silicone with air voids, or a metal oxide comprising air voids.

Figure 10:
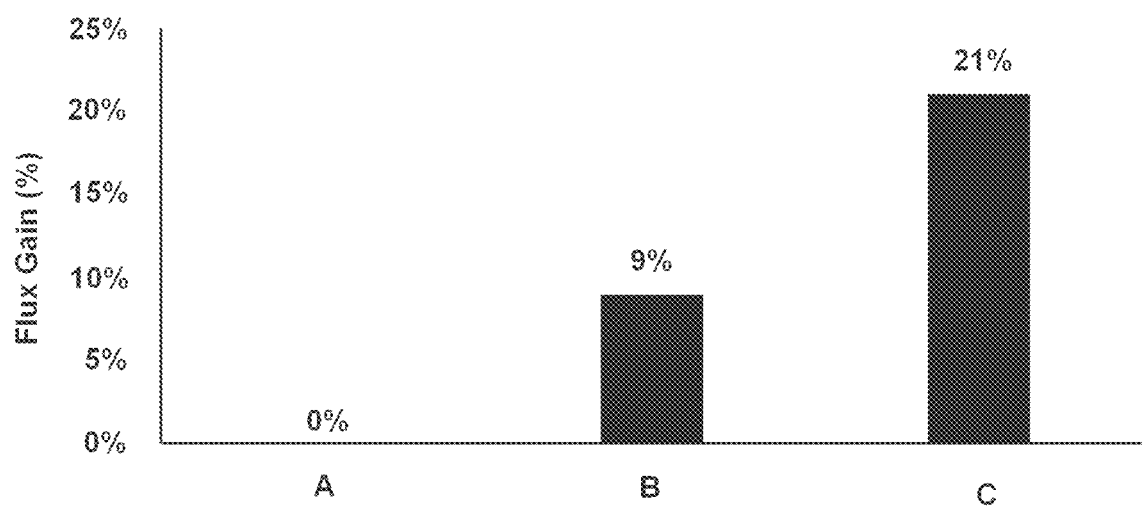
FIG. 10 is a plot comparing the output flux from two reference case pcLEDs to the output flux a pcLED comprising an example optical coupling layer as described herein.

FIG. 10 is a plot comparing the performance (output flux) of two reference case pcLEDs (A and B) to a pcLED (C) comprising an example optical coupling layer as described herein. In all three cases, the pcLED has a 40 micron die size and comprises a 10 micron thick phosphor layer disposed on a III-Nitride LED. The phosphor layer comprises 3 micron diameter Ce doped YAG particles immersed in an Aluminum Oxide matrix with 10% air voids. All three cases target a color of v'=0.473, u'=0.21.

In case A the light output surface of the semiconductor LED is not patterned (not grown on a patterned sapphire substrate) and the device does not include an optical coupling layer between the semiconductor LED and the phosphor layer.

Case B is the same as case A, except the light output surface of the semiconductor LED is patterned (grown on a patterned sapphire substrate). Case B exhibits a 9% flux gain compared to case A.

In case C the semiconductor LED light output surface is not patterned, as in case A. The phosphor layer is the same as in case A and case B, except for being 6 microns thick rather than 10 microns thick. The device of case C includes an optical coupling layer as taught herein disposed between the semiconductor LED and the phosphor layer. The optical coupling layer is 4 microns thick, and comprises 3 micron diameter Ce doped YAG particles embedded in a Titanium Oxide layer index matched, or approximately index matched, to the semiconductor LED light output surface. Case C exhibits a 21% flux gain compared to case A. The use of the optical coupling layer avoids the need for growth on a patterned sapphire substrate while still offering large gains compared to the reference case using the patterned sapphire substrate (i.e., a flux gain >10% compared to case B).

Figure 11A:
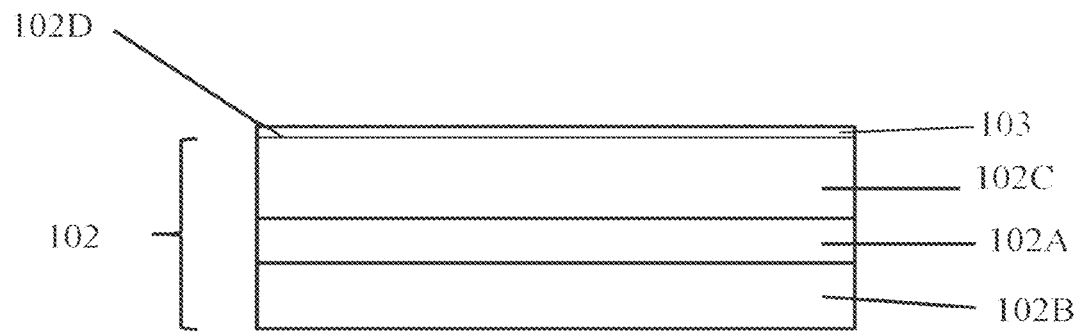
FIGS. 11A, 11B, and 11C illustrate schematically steps in an example method for manufacturing an example pcLED that includes a protective layer between the semiconductor LED and the optical coupling structure.
Figure 11B:
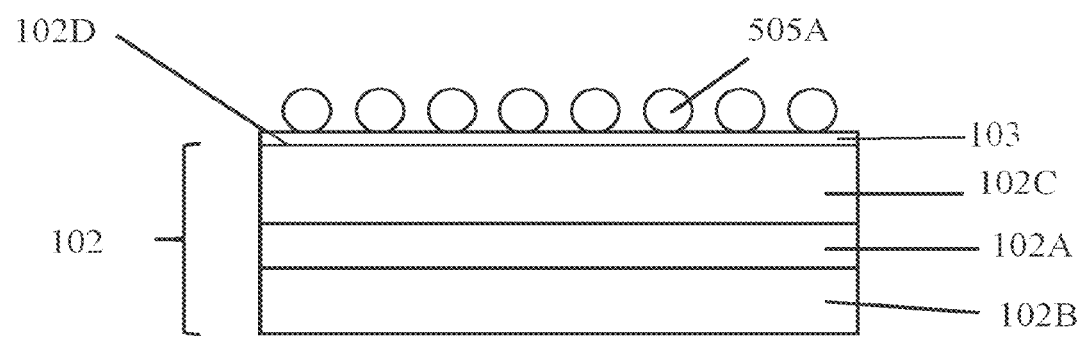
Figure 11C:
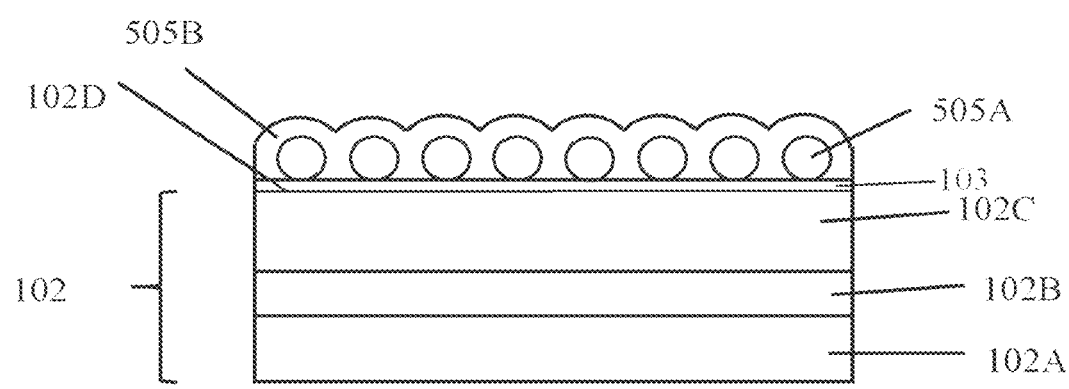

It has been observed in some instances that exposure to some metal or semiconductor oxide precursors, including some of those listed above used to form the high-index material 505B, degrades the light output surface 102D of the III-V semiconductor LED 102. That degradation can result in reduced reliability of the LED devices. Trimethyl aluminum (TMA), an $Al_2O_3$ precursor, is a notable example. Accordingly, FIGS. 11A through 11C illustrate schematically manufacturing an LED 102 with a protection layer 103 between the light output surface 102D and the optical coupling structure 505. The protection layer 103 can include one or more thin layers of one or more metal or semiconductor oxides different from the high-index material 505B.

Metal or semiconductor oxide materials suitable for inclusion in the protection layer 103 are substantially transparent at the operating wavelength(s) of the LED 102 (or pcLED), and have corresponding oxide precursors (e.g., metal or semiconductor halides, amides, alkylamides, alkoxides, or other reactive metal, semiconductor, or organometallic compounds used for ALD or other CVD processes) that are less reactive with respect to the III-V semiconductor surface 102D than the corresponding oxide precursors of the high-index material 505B. Some examples of materials suitable for the protection layer 103 include, e.g., $HfO_2$, $SiO_2$, $Ga_2O_3$, $GeO_2$, $SnO_2$, $CrO_2$, $TiO_2$, $Ta_2O_5$, $Nb_2O_5$, $V_2O_5$, $Y_2O_3$, or $ZrO_2$. Layers of those materials, and particularly multiple layers of different materials chosen from those material, are known form dense pinhole-free layers that are nearly impermeable to gasses such as water or trimethyl aluminum (TMA, an aluminum oxide precursor). Such impermeable layers may be desirable for forming the protection layer 103.

Choice of one or more specific materials for the protection layer 103 can be constrained by the material used for the high-index material 505B. For example, if $TiO_2$ is employed as the high-index material 505B, then a different material would be employed for the protection layer 505B, with corresponding oxide precursors less reactive than those of $TiO_2$. In some examples, $HfO_2$ is used to form the protection layer 103, using one or more corresponding precursors (e.g., tetrakis(dimethylamino)hafnium ($Hf(NMe_2)_4$), tetrakis(ethylmethylamino)hafnium ($Hf(NMeEt)_4$), or tetrakis(diethylamino)hafnium ($Hf(NEt_2)_4$)). The choice of material for the protection layer 103, and the high-index material 505B, in some instances can be constrained by limits on the reaction conditions permitted for the deposition process. For example, in some instances the LEDs are already mounted on a CMOS substrate, and so cannot be heated to more than 150° C.

In some examples the total thickness of the protection layer 103 can be less than about 50 nanometers or less than about 20 nanometers. In some examples wherein the protection layer 103 includes multiple layers, each of those layers can be less than about 20 nanometers thick, or less than about 10 nanometers thick.

Figure 12:
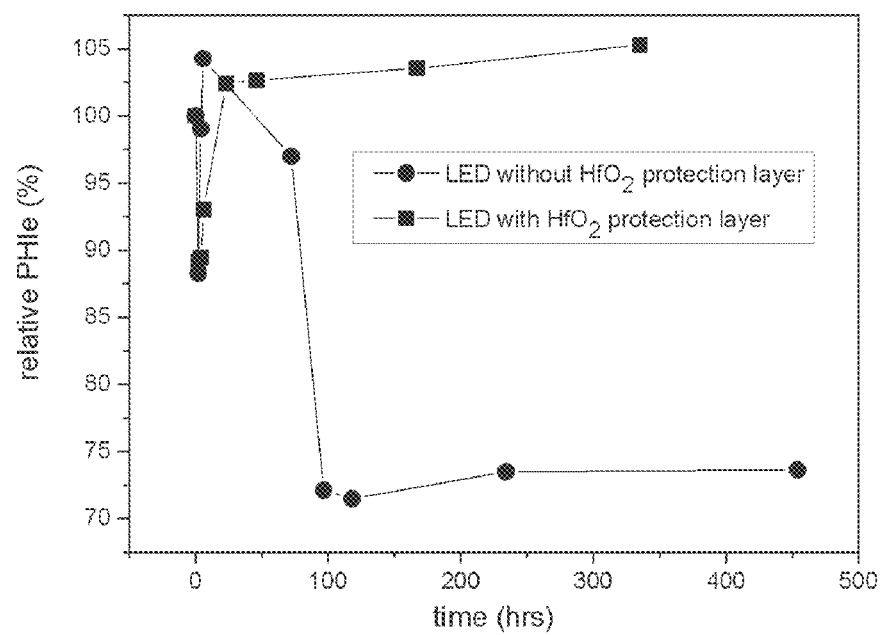
FIG. 12 is a plot showing contrasting reliability results for LEDs with and without a protection layer between the LED and a particle layer.

In the cross-sectional view of FIG. 11A, a protection layer 103 has been formed, using ALD or other suitable CVD process, on the light output surface 102D of the semiconductor LED 102. In FIG. 11B a single layer of phosphor particles 505A is deposited on the protection layer 103 using any suitable process, for example by sedimentation. In FIG. 11C, the high-index material 505B may be deposited, e.g., by ALD, to form a conformal coating on particles as shown in FIG. 11C (and described above). FIG. 12 shows contrasting reliability results for LEDs with and without an $HfO_2$ protection layer 103. Operated at 1 ampere at 85° C., the protected LED recovers nearly completely after about 50 hours if operation, whereas the unprotected LED exhibits significant, non-reversible degradation.

This disclosure is illustrative and not limiting. Further modifications will be apparent to one skilled in the art in light of this disclosure and are intended to fall within the scope of the appended claims.

In addition to the preceding, the following example embodiments fall within the scope of the present disclosure or appended claims:

Example 1

An apparatus comprising: (a) an array of semiconductor light emitting diodes having corresponding light output surfaces, each light emitting diode (i) having transverse dimensions less than about 1.0 millimeters and (ii) being separated from adjacent light emitting diodes of the array by less than about 0.10 millimeters; and (b) a corresponding optical coupling structure disposed on the corresponding light output surface of each light emitting diode of the array, each optical coupling structure comprising a plurality of light scattering particles coated with or embedded in a layer of transparent material, the layer of transparent material in physical contact with the corresponding light output surface and having an index of refraction matching or approximately matching an index of refraction of the corresponding light output surface.

Example 2

The apparatus of Example 1, wherein each light emitting diode (i) has transverse dimensions less than about 0.10 millimeters and (ii) is separated from adjacent light emitting diodes of the array by less than about 0.05 millimeters.

Example 3

The apparatus of any one of Examples 1 or 2, wherein each light emitting diode has a combined thickness of n-doped, active, and p-doped layers less than about 5 microns thick.

Example 4

The apparatus of any one of Examples 1 through 3, wherein each light output surface is a GaN, AlN, AlGaN alloy, GaP, AlGaP, or AlInGaP alloy material surface.

Example 5

The apparatus of any one of Examples 1 through 4, further comprising, for each light emitting diode of the array, a corresponding wavelength converting structure, wherein each corresponding optical coupling structure is disposed between the corresponding light output surface and the corresponding wavelength converting structure and is in physical contact with the corresponding wavelength converting structure.

Example 6

The apparatus of Example 5, wherein the light scattering particles include phosphor particles, and the phosphor particles in each optical coupling structure are arranged as only a single layer of phosphor particles disposed on or adjacent the corresponding light output surface.

Example 7

The apparatus of Example 5, wherein the light scattering particles include phosphor particles, and the phosphor particles in each optical coupling structure are arranged as two or more layers of phosphor particles disposed on or adjacent the corresponding light output surface.

Example 8

The apparatus of any one of Examples 5 through 7, wherein the light scattering particles include phosphor particles or voids or both in the layer of transparent material.

Example 9

The apparatus of any one of Examples 5 through 8, wherein each wavelength converting structure comprises phosphor particles dispersed in a matrix, and the index of refraction of the layer of transparent material in each optical coupling structure is greater than an index of refraction of the matrix.

Example 10

The apparatus of any one of Examples 5 through 9, wherein the layer of transparent material has a thickness greater than about 0.10 microns and less than about 5 microns.

Example 11

The apparatus of any one of Examples 5 through 10, wherein: (i) the light scattering particles comprise phosphor particles; and (ii) each wavelength converting structure comprises phosphor particles dispersed in a matrix having an index of refraction less than the index of refraction of the layer of transparent material in the corresponding optical coupling structure.

Example 12

The apparatus of Example 11, wherein the phosphor particles in each wavelength converting structure are of a same composition and size as the phosphor particles in the corresponding optical coupling structure.

Example 13

The apparatus of any one of Examples 1 through 12, wherein the transparent material includes one or more metal or semiconductor oxides.

Example 14

The apparatus of any one of Examples 1 through 13, wherein (i) the layer of transparent material has a thickness greater than or equal to about 0.10 microns and less than or equal to about 5.0 microns, or (ii) the phosphor particles have a diameter of about 2.0 microns to about 4.0 microns.

Example 15

The apparatus of any one of Examples 1 through 14, wherein material of the transparent layer includes one or more materials selected from a group consisting of $HfO_2$, $SiO_2$, $Ga_2O_3$, $GeO_2$, $Al_2O_3$, $SnO_2$, $CrO_2$, $Nb_2O_5$, $TiO_2$, $Ta_2O_5$, $V_2O_5$, $Y_2O_3$, and $ZrO_2$.

Example 16

The apparatus of any one of Examples 1 through 15, further comprising a corresponding transparent protection layer between the corresponding light output surface of each light emitting diode of the array the corresponding optical coupling structure, the protection layer including one or more metal or semiconductor oxides and being less than about 0.05 microns thick.

Example 17

The apparatus of Example 16, wherein material of the protection layer includes one or more materials selected from a group consisting of $HfO_2$, $SiO_2$, $Ga_2O_3$, $GeO_2$, $Al_2O_3$, $SnO_2$, $CrO_2$, $Nb_2O_5$, $TiO_2$, $Ta_2O_5$, $V_2O_5$, $Y_2O_3$, and $ZrO_2$.

Example 18

The apparatus of any one of Examples 16 or 17, wherein each protection layer is characterized by one or more oxide precursor reactivities, with respect to the light output surface of the corresponding light emitting device, that are less than one or more such oxide precursor reactivities characterizing the layer of transparent material.

Example 19

The apparatus of Example 18, wherein one or more oxide precursors can include one or more of $Al(CH_3)_3$, $HAl(CH_3)_2$, $Hf(N(CH_3)_2)_4$, $Hf(N(CH_2CH_3)_2)_4$, $TaCl_5$, $Ta(N(CH_3)_2)_5$, $ZrCl_4$, $Zr(N(CH_3)_2)_4$, $TiCl_4$, $Ti(OCH_3)_4$, $Ti(OEt)_4$, $SiCl_4$, $H_2N(CH_2)_3Si(OEt)_3$, $Si(OEt)_4$, tert-(butylimido)-tris(diethylamino)-niobium, tris(ethylcyclopentadienyl) yttrium, tetrakis(dimethylamino)hafnium ($Hf(NMe_2)_4$), tetrakis(ethylmethylamino)hafnium ($Hf(NMeEt)_4$), tetrakis(diethylamino)hafnium ($Hf(NEt_2)_4$), trimethylaluminum ($Al(CH_3)_3$), or dimethylaluminum hydride ($HAl(CH_3)_2$).

Example 20

The apparatus of any one Examples 16 through 19, wherein (i) the protection layer includes $HfO_2$, (ii) the protection layer oxide precursors include one or more of tetrakis(dimethylamino)hafnium ($Hf(NMe_2)_4$), tetrakis(ethylmethylamino)hafnium ($Hf(NMeEt)_4$), or tetrakis(diethylamino)hafnium ($Hf(NEt_2)_4$), (iii) the coating layer includes $Al_2O_3$, and (iv) the coating layer oxide precursors include one or more of trimethylaluminum ($Al(CH_3)_3$) or dimethylaluminum hydride ($HAl(CH_3)_2$).

Example 20

A method for making the apparatus of any one of Examples 1 through 19, the method comprising: forming, on a corresponding light output surface of each semiconductor light emitting diode of an array, a corresponding optical coupling structure comprising light scattering particles coated by or embedded in a layer of transparent material having an index of refraction matching or approximately matching an index of refraction of the corresponding light output surface.

Example 21

The method of Example 20, wherein each optical coupling structure is formed on a protection layer on the light output surface of the corresponding light emitting diode, and oxide precursors of the transparent material exhibit greater reactivities, with respect to the light output surface of the corresponding light emitting device, than one or more such oxide precursor reactivities characterizing the protection layer.

Example 22

The method of any one of Examples 20 or 21, further comprising disposing on the optical coupling structure a wavelength converting structure comprising phosphor particles dispersed in a matrix material having an index of refraction less than the index of refraction of the layer of transparent material in the optical coupling structure.

Example 23

The method of any one of Examples 20 through 22, wherein: (i) the layer of transparent material in the optical coupling structure comprises a metal oxide and the scattering particles in the optical coupling structure comprise phosphor particles disposed on or adjacent the light output surface; and (ii) forming the optical coupling structure comprises disposing the phosphor particles on or adjacent the light output surface of the semiconductor light emitting diode and depositing the metal oxide on the light output surface and on the phosphor particles disposed on the light output surface by atomic layer deposition.

Example 24

The method of any one of Examples 20 through 23, wherein: (i) the layer of transparent material in the optical coupling structure comprises a metal oxide and the scattering particles in the optical coupling structure comprise voids in the layer of transparent material; and (ii) forming the optical coupling structure comprises depositing the metal oxide on the light output surface by atomic layer deposition and embedding the voids in the transparent layer by allowing incomplete reaction during the atomic layer deposition process.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted.

For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. An apparatus comprising:
   (a) an array of semiconductor light emitting diodes having corresponding light output surfaces, each light emitting diode (i) having transverse dimensions less than about 1.0 millimeters and (ii) being separated from adjacent light emitting diodes of the array by less than about 0.10 millimeters; and
   (b) a corresponding optical coupling structure disposed on the corresponding light output surface of each light emitting diode of the array, each optical coupling structure comprising a plurality of light scattering particles coated with or embedded in a layer of transparent material, the layer of transparent material in physical contact with the corresponding light output surface and having an index of refraction matching or approximately matching an index of refraction of the corresponding light output surface.

2. The apparatus of claim 1, wherein each light emitting diode (i) has transverse dimensions less than about 0.10 millimeters and (ii) is separated from adjacent light emitting diodes of the array by less than about 0.05 millimeters.

3. The apparatus of claim 1, wherein each light emitting diode has a combined thickness of n-doped, active, and p-doped layers less than about 5 microns thick.

4. The apparatus of claim 1, wherein each light output surface is a GaN, AlN, AlGaN alloy, GaP, AlGaP, or AlInGaP alloy material surface.

5. The apparatus of claim 1, further comprising, for each light emitting diode of the array, a corresponding wavelength converting structure, wherein each corresponding optical coupling structure is disposed between the corresponding light output surface and the corresponding wavelength converting structure and is in physical contact with the corresponding wavelength converting structure.

6. The apparatus of claim 5, wherein the light scattering particles include phosphor particles, and the phosphor particles in each optical coupling structure are arranged as only a single layer of phosphor particles disposed on or adjacent the corresponding light output surface.

7. The apparatus of claim 5, wherein the light scattering particles include phosphor particles, and the phosphor particles in each optical coupling structure are arranged as two or more layers of phosphor particles disposed on or adjacent the corresponding light output surface.

8. The apparatus of claim 5, wherein the light scattering particles include phosphor particles or voids or both in the layer of transparent material.

9. The apparatus of claim 5, wherein each wavelength converting structure comprises phosphor particles dispersed in a matrix, and the index of refraction of the layer of transparent material in each optical coupling structure is greater than an index of refraction of the matrix.

10. The apparatus of claim 5, wherein the layer of transparent material has a thickness greater than about 0.10 microns and less than about 5 microns.

11. The apparatus of claim 5, wherein: (i) the light scattering particles comprise phosphor particles; and (ii) each wavelength converting structure comprises phosphor particles dispersed in a matrix having an index of refraction less than the index of refraction of the layer of transparent material in the corresponding optical coupling structure.

12. The apparatus of claim 11, wherein the phosphor particles in each wavelength converting structure are of a same composition and size as the phosphor particles in the corresponding optical coupling structure.

13. The apparatus of claim 12, wherein the transparent material includes one or more metal or semiconductor oxides.

14. The apparatus of claim 13, wherein (i) the layer of transparent material has a thickness greater than or equal to about 0.10 microns and less than or equal to about 5.0 microns, or (ii) the phosphor particles have a diameter of about 2.0 microns to about 4.0 microns.

15. The apparatus of claim 1, further comprising a corresponding transparent protection layer between the corresponding light output surface of each light emitting diode of the array the corresponding optical coupling structure, the protection layer including one or more metal or semiconductor oxides and being less than about 0.05 microns thick.

16. The apparatus of claim 15, wherein each protection layer is characterized by one or more oxide precursor reactivities, with respect to the light output surface of the corresponding light emitting device, that are less than one or more such metal oxide precursor reactivities characterizing the layer of transparent material.

17. A method for making a light emitting device, the method comprising: forming, on a corresponding light output surface of each semiconductor light emitting diode of an array, a corresponding optical coupling structure comprising light scattering particles coated by or embedded in a layer of transparent material having an index of refraction matching or approximately matching an index of refraction of the corresponding light output surface, each light emitting diode (i) having transverse dimensions less than about 1.0 millimeter and (ii) being separated from adjacent light emitting diodes of the array by less than about 0.10 millimeters.

18. The method of claim 17, wherein each light emitting diode (i) has transverse dimensions less than about 0.10 millimeters and (ii) is separated from adjacent light emitting diodes of the array by less than about 0.05 millimeters.

19. The method of claim 17, wherein each optical coupling structure is formed on a protection layer on the light output surface of the corresponding light emitting diode, and metal oxide precursors of the transparent material exhibit greater reactivities, with respect to the light output surface of the corresponding light emitting device, than one or more such oxide precursor reactivities characterizing the protection layer.

20. The method of claim 17, further comprising disposing on the optical coupling structure a wavelength converting structure comprising phosphor particles dispersed in a matrix material having an index of refraction less than the index of refraction of the layer of transparent material in the optical coupling structure.

21. The method of claim 17, wherein:
(i) the layer of transparent material in the optical coupling structure comprises a metal oxide and the scattering particles in the optical coupling structure comprise phosphor particles disposed on or adjacent the light output surface; and
(ii) forming the optical coupling structure comprises disposing the phosphor particles on or adjacent the light output surface of the semiconductor light emitting diode and depositing the metal oxide on the light output surface and on the phosphor particles disposed on the light output surface by atomic layer deposition.

22. The method of claim 17, wherein:
(i) the layer of transparent material in the optical coupling structure comprises a metal oxide and the scattering particles in the optical coupling structure comprise voids in the layer of transparent material; and
(ii) forming the optical coupling structure comprises depositing the metal oxide on the light output surface by atomic layer deposition and embedding the voids in the transparent layer by allowing incomplete reaction during the atomic layer deposition process.

* * * * *

UNITED STATES PATENT AND TRADEMARK OFFICE
CERTIFICATE OF CORRECTION

PATENT NO. : 11,362,243 B2
APPLICATION NO. : 17/066266
DATED : June 14, 2022
INVENTOR(S) : Antonio Lopez-Julia et al.

It is certified that error appears in the above-identified patent and that said Letters Patent is hereby corrected as shown below:

In the Claims

Column 18 Line 50 (4th Line of Claim 15). Insert --and-- between "array" and "the".

Signed and Sealed this
Twelfth Day of March, 2024

Katherine Kelly Vidal
*Director of the United States Patent and Trademark Office*